United States Statutory Invention Registration [19]

[11] Reg. Number: H1005

Gerlach [43] Published: Dec. 3, 1991

[54] GRAM-SCHMIDT SPACE-TIME ADAPTIVE FILTER USING TRANSVERSE ORTHONORMAL LADDER FILTERS

[75] Inventor: Karl Gerlach, Dunkirk, Md.

[73] Assignee: United States of America, Washington, D.C.

[21] Appl. No.: 635,903

[22] Filed: Dec. 26, 1990

[51] Int. Cl.[5] ..... H03H 7/01

[52] U.S. Cl. ..... 342/378; 342/160; 342/162; 342/195; 333/166; 333/174; 364/572; 364/724.01; 364/724.19

*Primary Examiner*—Bernarr E. Gregory

*Attorney, Agent, or Firm*—Thomas E. McDonnell

[57] ABSTRACT

A space-time adaptive filter system is provided for eliminating unwanted signals from a radar or communication system. The filter system receives a main channel and several auxiliary channels wherein the target signal is not correlated between the various signal channels. Correlated noise components are eliminated by decorrelating the signals. The adaptive filter includes a Gram-Schmidt processor for sequentially decorrelating the auxiliary signals from the main signal. Each decorrelation element of the Gram-Schmidt processor comprises a transverse orthonormal ladder filter.

7 Claims, 5 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

GRAM-SCHMIDT SPACE-TIME ADAPTIVE FILTER USING TRANSVERSE ORTHONORMAL LADDER FILTERS

FIELD OF THE INVENTION

The invention generally relates to adaptive processors and in particular to an adaptive processing apparatus utilizing a transverse orthonormal ladder filter in combination with a Gram-Schmidt filter for adaptively filtering space-time data channels.

BACKGROUND OF THE INVENTION

Signal information received by a radar system frequently includes unwanted echoes reflected from stationary or slowly moving reflectors such as the ground or sea, or from wind driven rain or chaff. The unwanted echoes obscure desired signals—such as those reflected from a moving target. The desired signal usually varies quickly with time, whereas the unwanted signals vary slowly with time. This difference can be exploited to eliminate the unwanted signals because data pulses corresponding to quickly varying signals are un-correlated as a function of time whereas slowly varying signals are correlated with time. In other words, stationary reflectors yield return echoes that include frequency components which vary more slowly than the frequency components of the desired moving target. Therefore, unwanted signals can be reduced or eliminated by canceling the time-correlated components from the received signals.

To this end, various systems and techniques have been devised which filter unwanted signals by isolating the correlated components of a received signal and then canceling the correlated components from the received signal. One such system is a numeric filter that adapts to the estimated statistical characteristics of input or output signals (see generally, R. A. Monzingo and T. W. Miller, Introduction to Adaptive Arrays, (John Wiley and Sons, New York, 1980), Chap. 8). A particular embodiment of an adaptive processor is an space-time adaptive canceler which yields one filtered output channel from a plurality of sensor output channels. The space-time adaptive canceler obtains weight factors corresponding to the coherent output from each sensor channel and then combines the weighted outputs to yield one output channel. With properly chosen weight factors, the noise elements of the sensor channels are reduced or eliminated.

FIG. 1 illustrates the general form of a space-time adaptive canceler which decorrelates or statistically orthogonalizes the time samples of a group of auxiliary channels from a main channel. The auxiliary channels are linearly weighted such that the output noise power residue of the main channel is minimized. This is equivalent to statistically orthogonalizing the auxiliary channels with respect to the main channel. In FIG. 1 the main channel input is designated $x_0$, and the auxiliary channels are designated $x_n$, $n=1, 2, \ldots, N-1$, with the number of auxiliary channels, $N-1$, further dnoted $N_{aux}$. The signals received from the auxiliary sensors are sampled L times at equal intervals of T seconds. The main sensor is also sampled in time and can be delayed by an arbitrary time delay $\tau$.

The time-delayed sample of the nth auxiliary input channel designated by a row vector x:

$$x_n=(x_n(t), x_n(t-T), \ldots, x_n(t-(L-1)T)) \tag{1}$$

with the optimal weight row vector $w_n$ for $x_n$ represented by $$w_n=(w_{1n}, w_{2n}, \ldots w_{Ln}). \tag{2}$$

A $LN_{aux}$ length column vector, X, comprising all auxiliary input data is $$X=(x_1, x_n, \ldots x_{Naux})^T, \tag{3}$$

where T denotes the vector transpose operation. A $LN_{aux}$ length optimal weight column vector W comprising all auxiliary weights is $$W=(w_1, w_2, \ldots w_{Naux})^T. \tag{4}$$

$R_{xx}$ represents the $LN_{aux} \times LN_{aux}$ input covariance matrix of the auxiliary inputs and r is the $LN_{aux}$ length cross-covariance vector between the main and the $LN_{aux}$ auxiliary inputs, or more formally, $$R_{xx}=E\{X^*X^T\}, \tag{5}$$

$$r=E\{X^*x_0\}, \tag{6}$$

where $E\{\cdot\}$ denotes the expected value.

The vector, W, therefore, is the solution of the linear vector equation:

$$R_{xx}W=r. \tag{7}$$

Again, see generally, R. A. Monzingo and T. W. Miller, Introduction to Adaptive Arrays, (John Wiley and Sons, New York, 1980), Chap. 8.)

Also, since the time-delayed samples from each auxiliary channel are statistically stationary, the $L \times L$ covariance matrix $R_{XnXn}$ of the nth auxiliary channel, $$R_{XnXn}=E\{x_n^*x_n^T\}, \tag{8}$$

$R_{XnXn}$ is a hermitian toeplitz matrix having the form:

$$R_{xnxn}=\begin{bmatrix} r_0 & r_1 & r_2 & \cdots & r_{L-1} \\ r_1^* & r_0 & r_1 & \cdots & r_{L-2} \\ r_2^* & r_1^* & r_0 & \cdots & r_{L-3} \\ \cdot & & & & \\ \cdot & & & & \\ \cdot & & & & \\ r_{L-1}^* & r_{L-2}^* & r_{L-3}^* & \cdots & r_0 \end{bmatrix} \tag{9}$$

A space-time adaptive cancellation method first solves equation (7) for the optimal decorrelation weights by exploiting the fact that matrix $R_{XnXn}$ is a hermitian toeplitz matrix, then applies the weights, as shown in FIG. 1, to produce one filtered output channel.

In a Gram-Schmidt canceler the optimal weights formulated by Equation (7) are not computed, rather the data in the input channels are filtered directly through an orthogonalization network. The steady state output residue is the same as if the weights were separately calculated using Equation (7) and then applied to the input data set.

FIG. 2 shows a general M-input open loop Gram-Schmidt canceler with $y_0, y_1 \ldots, y_{M-1}$ representing the complex data in the 0th, 1st, . . . ,M−1th channels, respectively, where $y_0$ is the main channel, and the remaining M−1 inputs are the auxiliary channels. The Gram-Schmidt canceler sequentially decorrelates each auxiliary input channel from the other input channels by using the two-input decorrelation canceler shown in FIG. 3. For example, as seen in FIG. 2, in the first level of decomposition, $y_{M-n}$ is decorrelated with $y_0, y_1, \ldots, y_{M-2}$. Next, the output channel resulting from the decorrelation of $y_{M-1}$ with $y_{M-2}$ is decorrelated with the other outputs of the first level decorrelation processors. This decomposition process is repeated until one final output channel remains.

More specifically, with $y_n^{(m)}$ representing the output of the decorrelation processors on the mth level, the output of the decorrelation processors of the m+1th level are given by:

$$y_n^{(M+1)} = y_n^{(m)} - w_n^{(m)} y_{M-m}^{(m)} \quad \begin{matrix} n = 0, 1, \ldots, M-m-1 \\ m = 1, 2, \ldots, M-1 \end{matrix} \tag{10}$$

wherein that $y_n^{(1)} = y_n$. The weight $w_n^{(m)}$, seen in Equation (10), is computed to decorrelate $y_n^{(m+1)}$ with $y_{M-m}^{(m)}$. Since the decorrelation weights in each of the decorrelation processors are computed from a finite number of input samples rather than an infinite number, the decorrelation weights are only estimates of the optimal weights discussed above in connection with Equation (2). For K input samples per channel, weight $w_n^{(m)}$ is estimated as $$w_n^{(m)} = \frac{\sum_{k=1}^{K} y_{M-m}^{(m)*}(k) y_n^{(m)}(k)}{\sum_{k=1}^{K} |y_{M-m}^{(m)*}(k) y_n^{(m)}(k)|} \tag{11}$$

where * denotes the complex conjugate, $|\cdot|$ is the magnitude, and k indexes the sampled data.

Examples of adaptive processors and components thereof include U.S. Pat. No. 4,149,259 (Kowalski) which discloses to an adaptive processor employing a transverse filter for convoluted image reconstruction; U.S. Pat. No. 4,196,405 (Le Dily et al.) which discloses an adaptive processor utilizing a transverse filter particularly adapted to the filtering of noise from the transmission of data over telephone lines; U.S. Pat. No. 4,459,700 (Kretschmer, Jr. et al.) which discloses a moving target indicator system employing an adaptive processor; U.S. Pat. No. 3,952,188 (Sloate et al.) which discloses an adaptive processor utilizing a monolithic transverse filter; U.S. Pat. No. 4,038,536 (Feintuch) which discloses an adaptive processor utilizing a recursive least mean square error filter and U.S. Pat. No. 4,489,320 (Lewis et al.) which discloses a moving target indicator system utilizing an adaptive processor. Other patents directed to related techniques include: U.S. Pat. No. 4,489,392 (Lewis) which discloses a orthogonalizer for filtering in phase and quadrature digital data; U.S. Pat. No. 4,222,050 (Kiuchi et al.) which discloses a Moving Target Indicator System and U.S. Pat. No. 4,471,357 (Wu et al.) which discloses a transverse filter for use in filtering the output from a synthetic aperture radar system.

SUMMARY OF THE INVENTION

In accordance with a preferred embodiment of the invention, a adaptive noise filter is provided for receiving a plurality of input signals corresponding to the same target signal and for converting said plurality of input signals into one filtered output signal. The adaptive noise filter comprises a plurality of transverse orthonormal ladder filters arranged in a Gram-Schmidt configuration for sequentially decorrelating each of the input signals from each of the other input signals to thereby yield said one filtered output signal.

An adaptive processor constructed in accordance with the invention uses fewer two-input decorrelation processors than the prior art Gram-Schmidt canceler of FIG. 2. For example, with five time samples per channel, the invention uses approximately one-fifth as many two-input decorrelation processors as the prior art Gram-Schmidt canceler. Likewise, the numeric efficiency of the invention to the present Gram-Schmidt canceler is inversely proportional to the number of pulses per channel where numeric efficiency is defined as the total number of complex multiplications.

Other features and advantages of the invention will be set forth in, or be readily apparent from, the detailed description of the preferred embodiments of the invention which follows.

DETAILED DESCRIPTION OF THE PREFERRED EMBODIMENT

Figure 1:
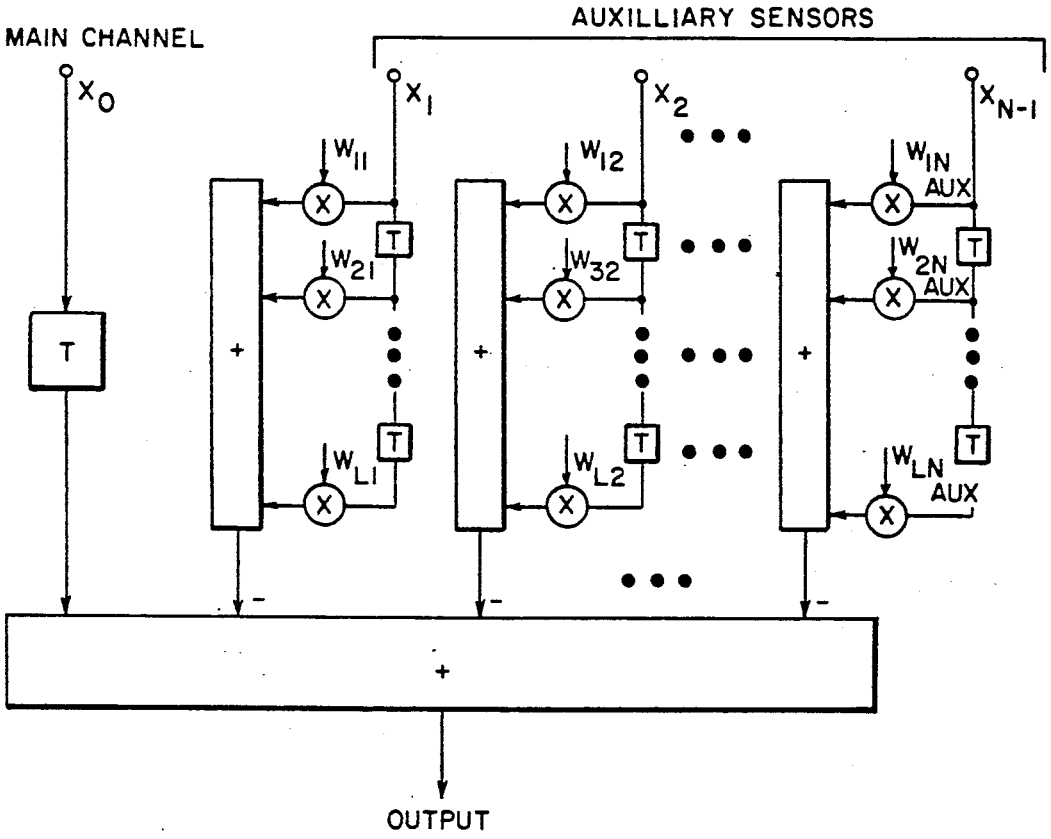
PRIOR ART FIG. 1
FIG. 1 is a block diagram of a prior art space-time adaptive canceler.
Figure 2:
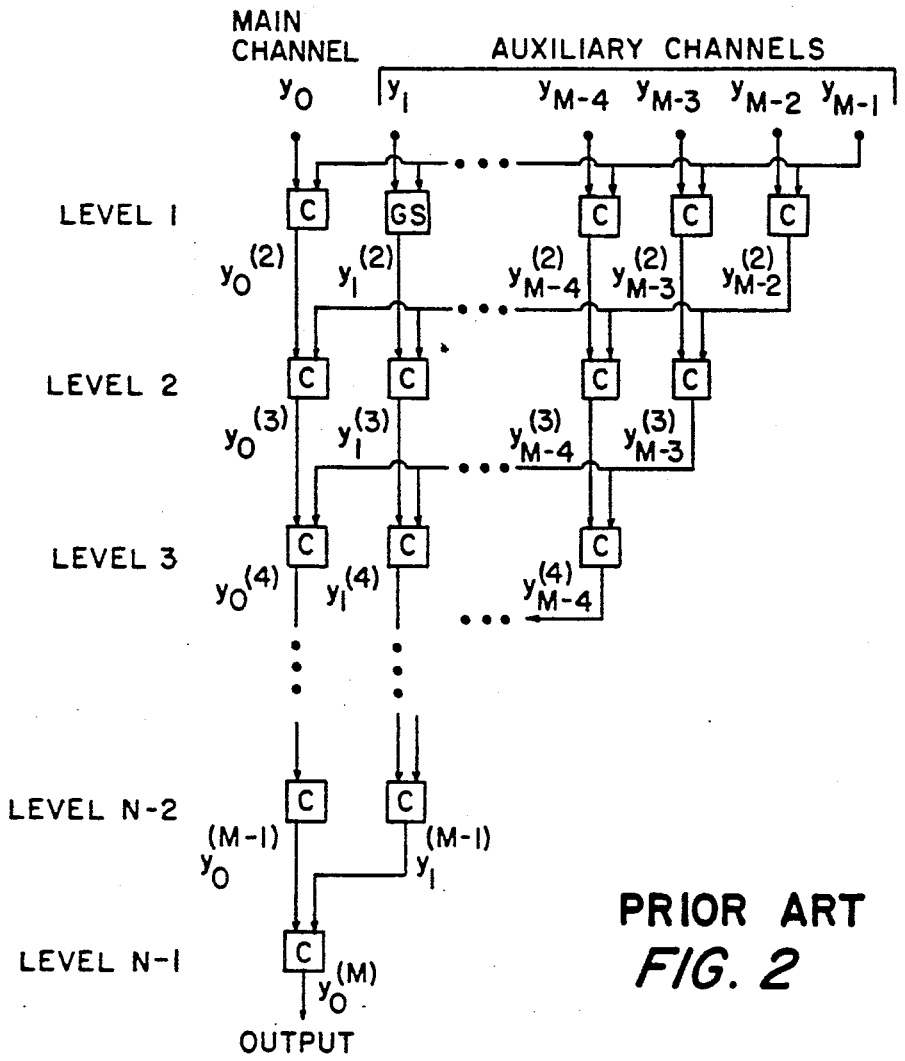
PRIOR ART FIG. 2
FIG. 2 is a block diagram of a prior art Gram-Schmidt canceler.
Figure 3:
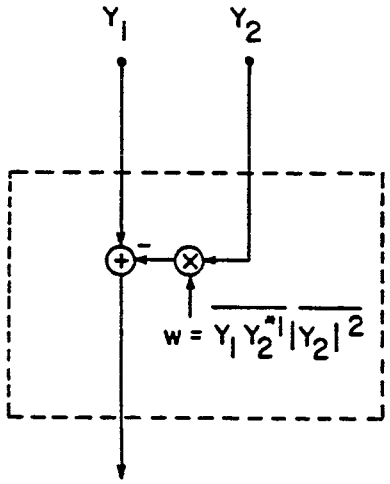
PRIOR ART FIG. 3
FIG. 3 is a block diagram of a prior art two-input decorrelation processor.
Figure 4:
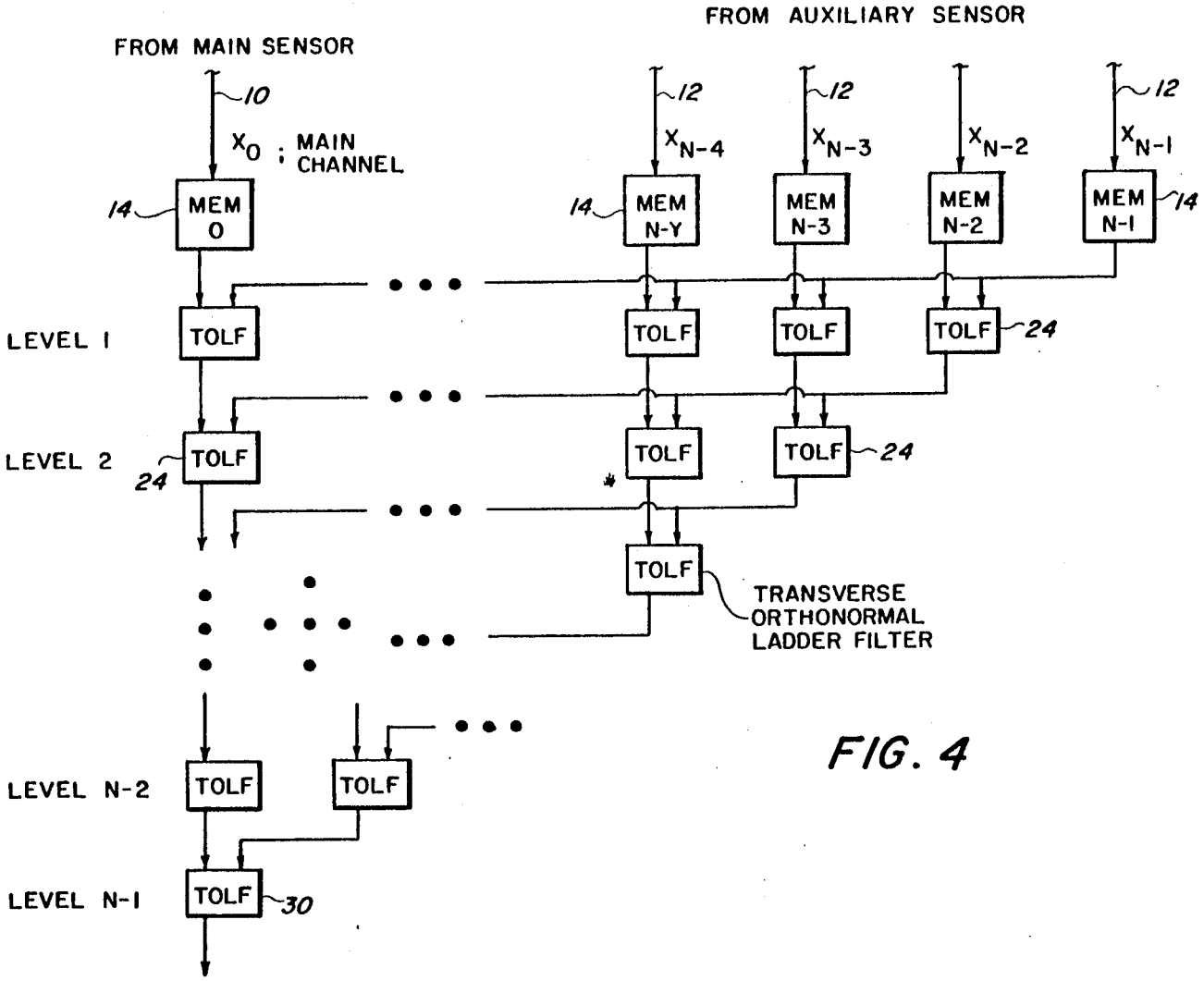
FIG. 4 is a block diagram of an adaptive noise canceler in accordance with a preferred embodiment of the present invention.
Figure 5:
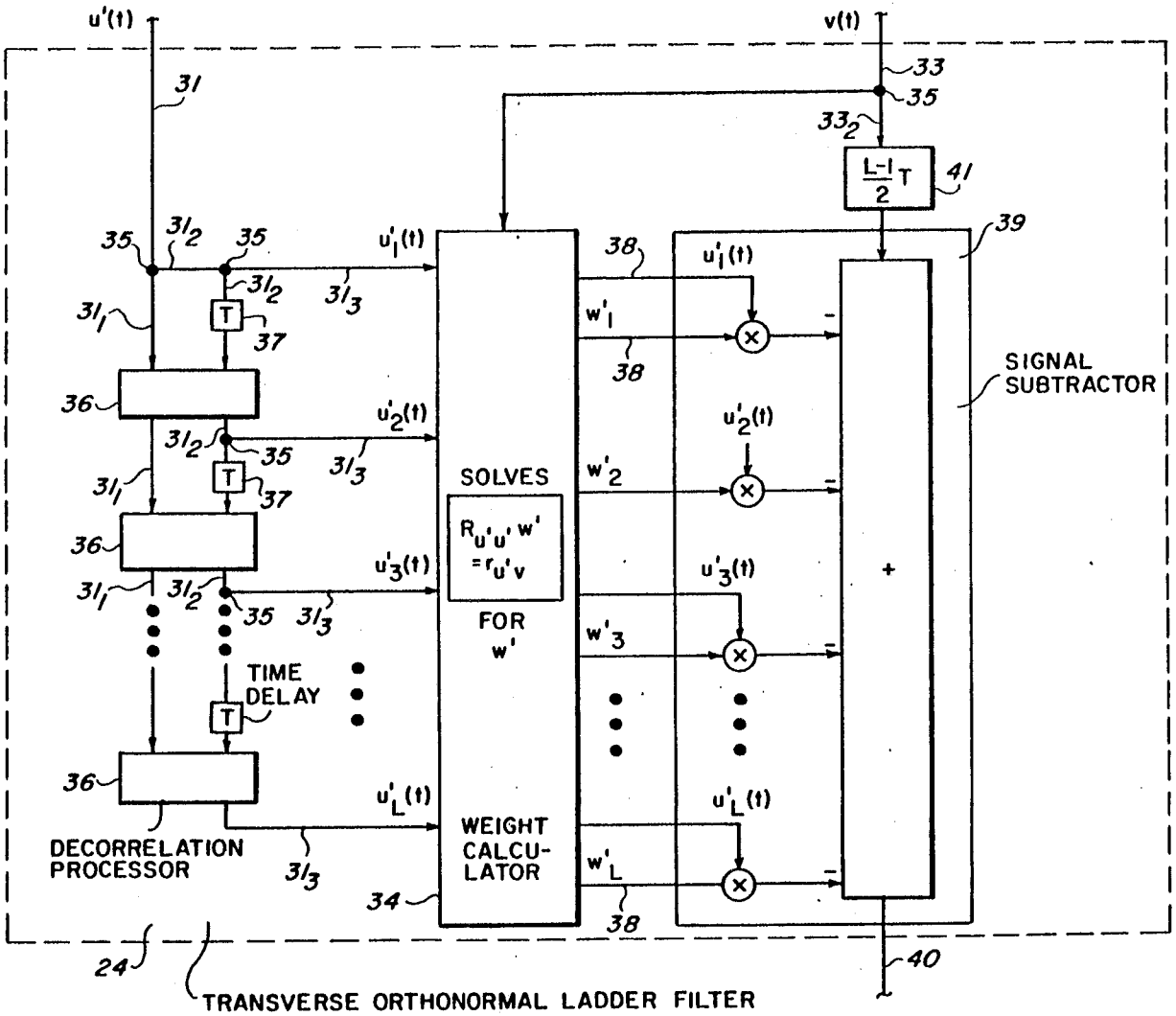
FIG. 5 is a block diagram of the transverse orthonormal ladder filter used in the embodiment of FIG. 4.
Figure 6:
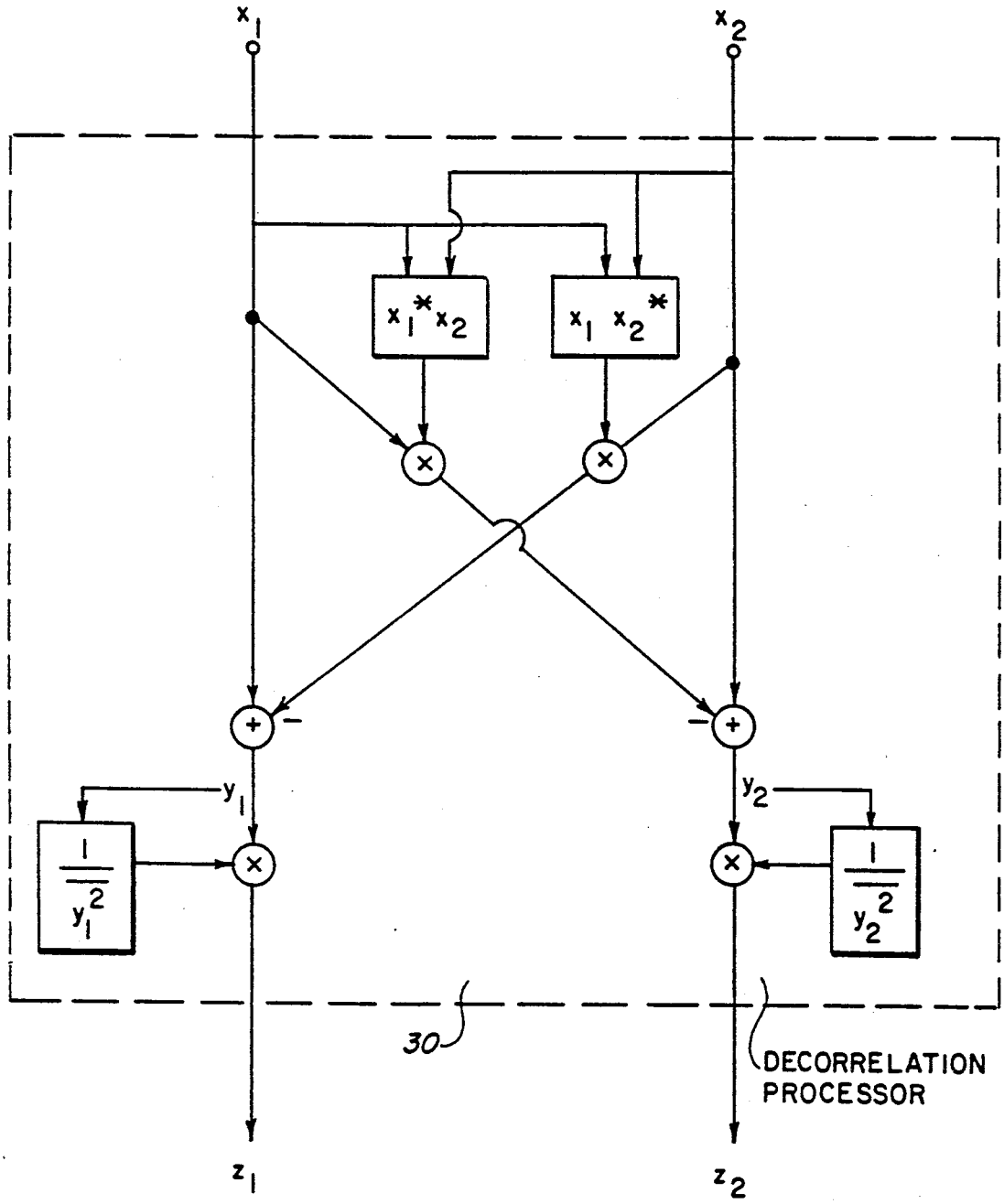
FIG. 6 is a block diagram of the two-input decorrelation processor of the embodiment of FIG. 4.

Referring to FIGS. 4, 5 and 6, a preferred embodiment of an adaptive noise canceler of the invention will now be described. As discussed above, the adaptive canceler is designed for use with a signal processing system having a plurality of sensors each receiving signal input corresponding to the same target or source. The signal processing system can be a conventional system such as a radar moving target indicator system, a sonar system, or a communication system. However, the adaptive noise canceler of the invention can be advantageously applied to any signal receiving system which includes a plurality of signal receivers.

As shown in FIG. 4, input signals to the adaptive canceler are received along main input data line 10 and along a N−1 auxiliary input data lines 12. The input along main data line 10 is designated $X_0$ while the input along auxiliary data lines 12 is designated $X_n$ for n=1 . . . N−1. As with a conventional space-time filter, the data on a each channel must be time stationary, i.e., the correlation functions are only a function of the time differences between channels. The provision of time-stationary input allows for transverse orthonormal ladder filters, described below, to be exploited for processing each channel.

Each dataline feeds into a separate data memory device, abbreviated $MEM_n$, with N=0, 1, . . . , N−1 and generally denoted 14, with $MEM_0$ receiving input from main dataline 10 and the remaining memory devices receiving input from auxiliary input lines 12. Each memory device 14 temporarily stores a portion of the signal received from the corresponding input data line and provides, as discussed below, a output vector containing time delayed pulses taken from the input signal.

Output from memory devices 14 is processed by a $N(N-1)/2$ identical transverse orthonormal ladder filters (TOLFs), generally denoted 24 in FIG. 4, which are arranged in Gram-Schmidt form, i.e., ladder filters 24 are arranged in N levels with each successive level having one fewer ladder filter. Each individual ladder filter 24 normalizes and orthogonalizes two input channels. In combination, ladder filters 24 sequentially decorrelate the auxiliary signals from the main signal. The arrangement of ladder filters 24 and the interconnections therebetween are of conventional Gram-Schmidt design and, hence, will not be discussed in complete structural detail. Rather, the arrangement of ladder filters 24 will be discussed primarily in functional terms, with, the internal structure of the individual ladder filters being described in detail below with reference to FIG. 5.

The time-delayed signal of the $x_{N-1}$ auxiliary channel, received from memory device, $MEM_{N-1}$, is orthogonalized by level 1 ladder filters, and proper weights are generated such that the output from level 1 ladder filters is decorrelated (statistically orthogonalized) with respect to the $x_0, x_1, \ldots, x_{N-2}$ channels received from the remaining memory devices 14. In FIG. 4, this operation occurs throughout the first level of ladder filters.

The resultant outputs from each of the $N-1$ ladder filters 24 of level 1 are statistically time stationary. Hence, where $N-1$ time-stationary auxiliary signals are initially provided for decorrelation with the main channel $X_0$, after level 1, only $N-2$ time-stationary auxiliary channels remain.

Next, the output signal from the $X_{N-1}$ ladder filter of level is orthogonalized by level 2 ladder filters 24, then proper weights are determined for decorrelation with the other $N-2$ output signals of the level 1 ladder filters 24. Hence after the second level of the decorrelation process, only $N-3$ time-stationary signals remain for decorrelation with main channel $X_0$.

The above operations are repeated in each successive level of ladder filters 24 until all auxiliary signals, received along datalines 12, are sequentially decorrelated from each other and from the main signal of dataline 10, leaving one output channel 30. In other words, output channel 30 carries the original input signal of main channel 10 with only the correlated components eliminated. Thus, after the final level of ladder filters 24, all correlated noise components of the main and auxiliary signals are eliminated—leaving one noise-free output signal on output channel 30.

Referring to FIGS. 5, the function and structure of an exemplary ladder filter 24 will now be described. Ladder filter 24 comprises a transverse orthonormal ladder filter. The input to ladder filter 24 is represented, in FIG. 5, by exemplary input signals u(t) and v(t) with each signal comprising L individual pulses sampled at equal intervals of T seconds. Input signals u(t) and v(t) can be represented in the vector form as:

$$u=(u(t),u(t-T),\ldots,u(t-(L-1)T))^T$$

$$v=(v(t),v(t-T),\ldots,v(t-(L-1)T))^T.$$

Ladder filter 24 first orthogonalizes u (with u' denoting the orthogonal representation of u), then calculates optimal weights w', corresponding to u' and v, before eliminating the correlated noise components from v by subtracting the product u'w from v.

More specifically, input signal vectors u and v are received by ladder filter 24 along input data lines 31 and 33, respectively. Data line 31 includes a plurality of conventional dataline splitters, each denoted 35, for splitting signals received on dataline 31 into identical signals.

Initially, input signal u is split into two identical signals and carried on datalines $\mathbf{31}_1$ and $\mathbf{31}_2$, with dataline $\mathbf{31}_2$ further split into two more datalines $\mathbf{31}_2$ and $\mathbf{31}_3$. Dataline $\mathbf{31}_3$ carries input signal u(t), also represented as $u'_1(t)$, to a weight calculator 34, described below, for calculating optimal weight $w'_1(t)$.

The signals on datalines $\mathbf{31}_1$ and $\mathbf{31}_2$ are fed through a series of conventional two-input decorrelation processors, generally denoted 36, which orthogonalize u to generate u'. As shown in FIG. 5, dataline $\mathbf{31}_1$ feeds directly into each decorrelation processor 36, whereas the signal on the $\mathbf{31}_2$ dataline is time-delayed by an amount T prior to each decorrelation processor 36 by a conventional time delay means, generally denoted 39.

An exemplary decorrelation processor 36 is shown in block diagram form in FIG. 6 with input $x_1$ and $x_2$ representing the data signals received along datalines $\mathbf{31}_1$ and $\mathbf{31}_2$, respectively. The output from decorrelation processor 36, which is transmitted along datalines $\mathbf{31}_1$ and $\mathbf{31}_2$, is represented by output signals $z_1$ and $z_2$, respectively. As shown in FIG. 6, decorrelation processor 36 decorrelates input signals $x_1$ and $x_2$ to produce decorrelated output signals $z_1$ and $z_2$.

Although the invention has been described with reference to the specific decorrelation processor architecture of FIG. 6, any suitable two-input two-output decorrelation processing architecture can be used. Since decorrelation processor 36 is of conventional design, it will not be described in further detail.

Returning to FIG. 5, since the two signals input to decorrelation processor 36 correspond to the same data signal (i.e. u(t)) with only a time delay difference (T), the output of decorrelation processor 36 is not merely decorrelated, but is also orthonormalized. The orthonormalized output of the nth decorrelation processor 36 is represented by $u_n'(t)$.

The output $u_n'(t)$ from each decorrelation processor 36, fed along dataline $\mathbf{31}_2$, is split into two identical channels, denoted $\mathbf{31}_2$ and $\mathbf{31}_3$ with dataline $\mathbf{31}_2$ carrying $u_n'(t)$ to the next decorrelation processor 36 for producing $u_{n+1}'(t)$, and dataline $\mathbf{31}_3$ carrying $u_n'(t)$ to a weight calculator 34, described below, for calculating optimal weight $w_n'$.

As shown in FIG. 5, a total of $L-1$ decorrelation processors 36 are provided in series to sequentially produce orthogonalized signals $u'_2(t), \ldots, u'_L(t)$, with $u'_1(t)$ representing the unprocessed input u(t). Note that the $z_1$ output of the last decorrelation processor 36 is merely discarded.

The v(t) input of dataline 33, unlike the u(t) input of dataline 31, is not orthonormalized, rather input v(t) is processed directly to weight calculator 34. Dataline 33 is split into two identical datalines, $\mathbf{33}_1$ and $\mathbf{33}_2$ by splitter 35, with dataline $\mathbf{33}_1$ connected directly to weight calculator 34 and dataline $\mathbf{33}_2$ connected to a conventional time delay means 41, for time centering the v(t) channel with the weighted u'(t) channels.

Now turning to the calculation of the weights. Optimal weight vector w' is be represented by:

$$w'=(w_1', w_2', \ldots, w_L')^T,$$

with individual elements corresponding to the L orthonormalized samples of the u signal; u(t), u(t−T), . . . ,u(t−(L−1)T). Weight vector w' is calculated by weight calculator 34 such that the noise residue of the v(t) channel is minimized when added to weighted orthonormalized time-delayed u'(t) signals.

As described above, conventional decorrelation weights w are solution of the vector equation:

$$R_{uu}w=r_{uv}, \tag{12}$$

where u(t) is an un-orthonormalized input signal, $R_{uu}$ is the L×L covariance matrix of the u(t) and v(t) signals and $r_{uv}$ is the cross-covariance vector of length L between u(t) and v(t).

As discussed above in relation to the prior art methods, the matrix $R_{uu}$ is a hermitian toeplitz matrix with elements $r_{k-j}$, k, j=1, 2, . . . , L. Since the samples of u are statistically time stationary, $$E\{u^*(t-kT)u(t-jT)\}=r_{k-j}, \tag{13}$$

i.e., the cross-covariance between any two time delay signals is a function of only the relative time delay between the pulses.

However, rather than solving Equation (12) for w, weight calculator 34 uses orthonormalized u' input data received along datalines 38 to solve for optimal weights. The orthogonality transformation is the L×L matrix A. With u'=Au, optimal weight vector w' satisfies the vector equation:

$$R_{u'u'}w'=r_{u'v}, \tag{14}$$

where $R_{u'u'}$ is the L×L covariance matrix of the orthonormalized u'(t) input data and $r_{u'v}$ is the cross-covariance vector of length L between the main channel and the orthogonalized inputs. The transformed time delayed signals are orthogonal, and hence the matrix $R_{u'u'}$ is diagonal. Thus, the solution of Equation (14) above, for w', is straightforward. Weight calculator 34 can comprise any conventional calculating or computing device for solving linear equations such as a microprocessor.

Weight calculator 34 is connected, via datalines 38, to a signal subtractor 39 which receives optimal weights w' and orthonormalized signals u' from weight calculator 34. Signal subtractor also receives the time-centered v signal from time delay means 41 along dataline $33_2$. Signal subtractor 39 multiplies w' by u', then subtracts the product w'u' from v. Output is provided along dataline line 40.

To summarize, each ladder filter 24, shown in FIG. 4, receives two input channels, u and v; uses decorrelation processors 37 to orthonormalize u; uses weight calculator 34 to solve equation (14) to thereby calculate optimal weight factors w' for decorrelating u from v; and finally uses signal subtractor 39 to subtract w'u from v to thereby eliminate the correlated components of u and v from v.

For a general discussion of transverse orthonormal ladder filters, see J. M. Delosme and M. Morf, "Mixed and Minimal Representations for Toeplitz and Related Systems," in Proc. 14th Asilomar Conf. Circuits, Systems & Computers (Pacific Grove, Calif., Nov. 1980), pp. 19–24.

Returning to FIG. 4, it is important to note that an inherent time delay of (L−1)T occurs in each ladder filter 24 before the ladder filter receives real data, i.e. non-zero input signals. To insure that unwanted transients, caused by a lack of real data, do not propagate into subsequent ladder filters 24, the output from each ladder filter 24 is deactivated until real data is received by all ladder filters of the same level. To accomplish this, the v(t) input for each ladder filter 24 requires L−1 more data samples than the u(t) input of the same ladder filter.

This requirement can be related to the number of data samples that must be initially provided to each data channel from each memory device 14. With $N_s$ being the number of data samples provided on the $X_0$ channel, then $N_s+L-1$ data samples must be provided on the $X_1$ channel, $N_s+2(L-1)$ data samples must be provided on the $X_2$ channel, and so on, with $N_s+(N-1)(L-1)$ data samples being provided on the $X_{N-1}$ channel.

Moreover, the number of data samples output from each ladder filter 24 must be the same as the number of data sample originally provided by the memory device 14 of the same column rank, as seen in FIG. 5. For example, each of the ladder filters of the zeroth column, i.e. the main channel column, must output at least $N_s$ data samples. In this manner, the unwanted transient responses of the ladder filters are eliminated.

As will be understood by those skilled in the art, the various elements of the invention can be implimented using various conventional calculator, computer or other electronic units such as, for example, microprocessors. Alternatively, the invention can be implemented in software and run on a computer, with the input signals first converted from analog to digital via a conventional analog to digital converter.

Thus, the present invention provides a Gram-Schmidt adaptive processor wherein each individual correlation element is a transverse orthonormal ladder filter. This configuration is numerically more stable and requires significantly fewer arithmetic operations than prior art methods.

Although the invention has been described with respect to exemplary embodiments thereof, it will be understood by those skilled in the art that variations and modifications can be effected in these exemplary embodiments without departing from the scope and spirit of the invention.

I claim:

1. In a Gram-Schmidt noise cancelation system having a plurality of individual decorrelation elements for sequentially decorrelating a main input signal from a plurality of auxiliary input signals for canceling the correlated noise components therefrom to thereby yield one filtered output signal, the improvement wherein each individual decorrelation element comprises a transverse orthonormal ladder filter.

2. An adaptive noise filter for receiving a plurality of input signals corresponding to the same target signal and for sequentially decorrelating said input signals to cancel the correlated noise components therefrom to thereby yield one filtered output signal, said adaptive noise filter comprising a plurality of transverse orthonormal ladder filters arranged in a Gram-Schmidt configuration for sequentially decorrelating each of said input signals from each other of said input signals to thereby yield said one filtered output signal.

3. An adaptive noise filter for receiving a plurality of input signals corresponding to the same target signal and for converting said plurality of input signals into one final filtered output signal vector, said noise filter comprising:

N input means for receiving N input signals, $X^{(0)}{}_n(t)$, where $n=1, \ldots, N$, each of said input signals having correlated noise components;

N memory means, $MEM^{(m)}{}_n$, where $n=1, \ldots, N$, each for receiving and storing one of said N input signals and for producing a vector $X^{(0)}{}_n$ of time-delayed output pulses corresponding to $X^{(0)}{}_n(t)$, $n=0, \ldots, N-1$, with said vector of output pulses $X^{(0)}{}_n$comprising $(X^{(0)}{}_n(t-t_d), X^{(0)}{}_n(t-2t_d), \ldots, X^{(0)}{}_n(t-N_n t_d)^T$; and $N(N-1)/2$ transverse orthonormal ladder filters, $TOLF^{(m)}{}_n$, $m=1, \ldots, N-1$, $n=0, \ldots, N-1-m$, arranged in $N-1$ levels with said mth level having $N-m$ said transverse orthonormal ladder filters, with ladder filter $TOLF^{(1)}{}_n$ receiving $X^{(0)}{}_n$ and $X^{(0)}{}_{N-1}$ from said memory devices, determining the correlated components thereof, and cancelling said correlated components therefrom to produce one output $X^{(1)}{}_{(n)}$, and with each subsequent level of ladder filters $TOLF^{(m)}{}_n$, $m=2, \ldots, N-1$, $n=0, N-1-m$, receiving output vectors, $X^{(m)}{}_n$ and $X^{(m)}{}_{N-m}$, from a previous level, determining the correlated components thereof, and cancelling said correlated components therefrom to produce one output vector $X^{(m-1)}{}_{(n)}$, such that said $N-1$th level, comprising only one of said transverse orthonormal ladder filters, $TOLF^{(N-1)}{}_n$, outputs said one final filtered output signal vector, $X^{(N-1)}{}_0$.

4. The adaptive noise filter of claim 3, wherein each of said transverse orthonormal ladder filters receiving input $X^{(m)}{}_n$ and $X^{(m)}{}_{N-m}$, comprises:

orthonormalization means for orthonormalizing $X^{(m)}{}_n$, with the orthonormal representation of $X^{(m)}{}_n$ denoted $X'^{(m)}{}_n$;

weight calculator means for calculating optimal decorrelation weights, $w'^{(m)}{}_n$, for decorrelating $X'^{(m)}{}_n$ from $X^{(m)}{}_{N-m}$; and signal subtractor means for subtracting the product of $w'^{(m)}{}_n$ and $X^{(m)}{}_n$ from $X^{(m)}{}_n$, to thereby produce said output vector $X^{(m+1)}{}_{(n)}$.

5. The adaptive noise filter of claim 4, wherein said orthonormalization means comprises L two-input two-output decorrelation processors, where L is an integer $\geqq 1$.

6. The adaptive noise filter of claim 5, wherein, to minimize the propogation of transients within said noise filter, $N_n=n(L-1)N_0$.

7. The adaptive noise filter of claim 5, wherein said weight calculator means calculates said optimal decorrelation weights, $w'^{(m)}{}_n$, for decorrelating $X'^{(m)}{}_n$ from $X^{(m)}{}_{N-m}$, by solving the equation:

$$R_{u'u'}w' = r_{u'v},$$

where $u'=X'^{(m)}{}_n$, $v'=X^{(m)}{}_{N-m}$, $R_{u'u'}$ is a $L \times L$ covariance matrix of u', and $r_{u'v'}$ is the cross-covariance vector of length L between the u' and v.

* * * * *